(12) United States Patent
Hayakawa

(10) Patent No.: US 6,278,298 B1
(45) Date of Patent: Aug. 21, 2001

(54) CURRENT-SENSE TYPE LOGIC CIRCUIT AND SEMICONDUCTOR INTEGRATED CIRCUIT USING THE SAME

(75) Inventor: Shigeyuki Hayakawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/369,896

(22) Filed: Aug. 9, 1999

(30) Foreign Application Priority Data

Aug. 10, 1998 (JP) .................................................. 10-226200

(51) Int. Cl.⁷ .......................... H03K 19/20; H03K 19/094
(52) U.S. Cl. ........................ 326/119; 326/121; 326/112; 326/105
(58) Field of Search .................................. 326/115, 104, 326/112, 119, 121, 126–127; 327/55–56

(56) References Cited

U.S. PATENT DOCUMENTS

| | | | |
|---|---|---|---|
| 4,973,864 | * | 11/1990 | Nogami .................................. 327/55 |
| 5,045,807 | * | 9/1991 | Ishihara et al. ...................... 326/126 |
| 5,949,256 | * | 9/1999 | Zhang et al. ........................... 327/56 |
| 5,977,798 | * | 11/1999 | Zerbe .................................... 326/115 |
| 6,025,747 | * | 2/2000 | Okayasu et al. ...................... 326/104 |

FOREIGN PATENT DOCUMENTS 64-27315   1/1989   (JP) .

* cited by examiner

Primary Examiner—Michael Tokar
Assistant Examiner—Steven S. Paik
(74) Attorney, Agent, or Firm—Oblon, Spivak, McClelland, Maier & Neustadt, P.C.

(57) ABSTRACT

A logic circuit determines the logic based only on a change in electric current. The logic circuit comprises a logical value determination circuit, a reference current generator, and a current sense amplifier. The logical value determination circuit defines a logical current flowing in response to multiple logic-signals. The reference current generator produces a reference current which is used to determine whether the logical current defined by the logical value determination circuit is true or false. The current sense amplifier detects and amplifies a difference between the logic current and the reference current.

24 Claims, 7 Drawing Sheets

CURRENT-SENSE TYPE LOGIC CIRCUIT AND SEMICONDUCTOR INTEGRATED CIRCUIT USING THE SAME

BACKGROUND OF THE INVENTION

1. Field of the Invention

This invention relates to a current-sense type logic circuit for determining logic based on electric current, and to a semiconductor integrated circuit using such a logic circuit. More particularly, the invention relates to a current-sense type logic circuit with an improved operation speed, and to a semiconductor integrated circuit using this logic circuit, which can increase the operation speed of the entire system of the circuit.

2. Description of the Related Art

In recent years, logic circuits, including CMOS logic circuits, dynamic logic circuits, and pseudo-nMOS logic circuits, tend to have a large number of inputs (and therefore, a large number of logic gates) due to complication of logic.

FIG. 7 illustrates an example of the multi-input logic circuit. This circuit is a pseudo-nMOS logic circuit disclosed in Sun Microsystems, "High-performance Microprocessors" ISSCC97, FA10.2, February 1997.

The pseudo-nMOS logic circuit shown in FIG. 7 has a logical value determination circuit 100, a driver 101 for driving the logical value determination circuit 100, and an inverter 102.

The driver 101 comprises a CMOS inverter consisting of a p-channel MOSFET PM1 and an n-channel MOSFET NM1. In operation, if a low-level voltage is applied to the gates of the p-channel MOSFET PM1 and the n-channel MOSFET NM1, the MOSFET PM1 is turned on, while the MOSFET NM1 remains in the OFF-state. The logic node X of the logical value determination circuit 100 is charged via the MOSFET PM1.

The logical value determination circuit 100 includes a plurality of n-channel MOSFETs N(0), N(1), . . . , N(n-1), N(n), which define multiple paths electrically connected in parallel between the logic node X and the ground GND. In this example, the first two paths have two MOSFETs connected in series, and the rest of the paths have a single MOSFET. To be more precise, MOSFETs N(0) and N(1) are connected in series to form a double-transistor path, and MOSFETs N(2) and N(3) are connected in series to form another double-transistor path. The gate of each MOSFET is connected to one of the logic signals IN[1], IN[2], . . . , IN[n-1], IN[n]. The logical inputs are either high (H) or low (L).

Let's consider a case in which high level logic signals IN[1] and IN[3] are applied to the gates of the MOSFET N(1) and N(3), and low level logic signals IN[0], IN[2], IN[4], IN[5], . .. IN[n] are applied to the rest of the MOSFETs. In this case, only two transistors N(1) and N(3) are turned on, while the rest of the transistors remain in the OFF state, and therefore, there are no electric paths existed which ground the logic node X. The logic node X maintains a high voltage charged by the driver 101 and the inverter 102 outputs an inverted value, i.e., a low-level signal.

In general, if a logic holds, the logic is called "TRUE", which is expressed as a high voltage H (or "1" in binary systems). If a logic does not hold, the logic is called "FALSE", which is expressed as a low voltage L (or "0" in binary systems). Accordingly, in the above-described case, the logical value output from the pseudo n-MOS logic circuit becomes FALSE.

On the contrary, if there are one or more electric paths formed between the logic node X and the ground GND, the voltage level of the logic node X transits from high to low because of the newly formed current path. Consequently, the inverter 102 outputs a high-level signal, which means that the logical value of this logic circuit is TRUE. This situation occurs if, for example, at least three of IN[0] through IN[3] are high, or alternatively, if at least one of In[4] through In[n] are high, with In[0] through IN[3] low.

Generally, many multi-input pseudo-nMOS logic circuits are incorporated in a semiconductor integrated circuit to form a circuit system. In each multi-input logic circuit, a considerable amount of parasitic capacitance is added to the logic node X because as the number of input gates increases, the total amount of capacitance added to the logic node X becomes large. The parasitic capacitance causes the operation speed to slow down. In the example shown in FIG. 7, the parasitic capacitance includes at least the wiring capacitance, and the source, gate, and drain capacitances of the MOSFETs N(0), N(1), . . . , N(n). When driving the logical value determination circuit 100, the driver 101 must charge the parasitic capacitance also, and the charging time greatly affects the delay time.

If the total amount of parasitic capacitance added to the logic node X is Cp, and the electric current required for the driver 101 to charge the logic node X is Ip, and if the threshold voltage of the inverter 102 is $V_{dd}/2$, then a delay time $\Delta t$ from the point of charging the logic node X to the point of actual output of the logical value of the logic circuit is expressed by Equation (1).

$$\Delta t = (Cp \times V_{dd})/(2Ip) \qquad (1)$$

It is apparent from Equation (1) that the delay time $\Delta t$ increases in proportion to the total amount of parasitic capacitance Cp. As the number of inputs increases due to the complication of logic, the parasitic capacitance inevitably increases in the conventional logic circuit. Accordingly, it was difficult for the conventional technique to implement a high-speed multi-input logic.

If several conventional multi-input logic circuits are incorporated in a semiconductor integrated circuit, the operation speed of the entire integrated circuit system becomes very slow because the operation speed of the integrated circuit system greatly depends on the operation speed of each multi-input logic circuit.

SUMMARY OF THE INVENTION

Therefore, it is an object of the invention to overcome these problems of the related art, and to provide a multi-input logic circuit that can implement a high-speed operation with a greatly reduced delay time.

It is another object of the invention to provide a logic circuit that has a sufficiently wide range of determination margin for the logical value in order to prevent an error determination, and to improve the reliability of the operation.

It is still another object of the invention to provide a logic circuit that can easily set and produce a reference current used in determination of the logical value.

It is yet another object of the invention to provide a logic circuit having an enhanced driving ability.

It is yet another object of the invention to provide a logic circuit that has a highly improved operation speed with reduced power consumption.

It is yet another object of the invention to provide a high-speed semiconductor integrated circuit using a multi-input logic circuit.

It is still another object of the invention to provide a semiconductor integrated circuit that has an improved reliability in its entire operation.

To achieve the object, in one aspect of the invention, a current-sense type logic circuit comprises a logical value determination, a reference current generator, and a current sense amplifier. The logic value determination circuit defines a logic value as logic current in response to multiple logic signals inputted externally. The reference current generator produces a reference current, which is used to determine logic. The current sense amplifier detects and amplifies a difference between the reference current and the logic current flowing through the logical value determination circuit corresponding to the logical value.

With this arrangement, only the current difference between the reference current and any electric current (i.e., a logic current) flowing in the logical value determination circuit is used to output a result of a logical operation. Unlike the conventional logic circuit, it is not necessary to drive the parasitic capacitance added to a logic node, and to wait until the parasitic capacitance is charged up to the threshold vale. Accordingly, delay time is sufficiently reduced, and the operation speed of the logic circuit is greatly improved.

The logical value determination circuit comprises a plurality of determination elements, each of which corresponds to one of the logical input signals applied externally. The determination elements define multiple electric paths in the logical value determination circuit.

Preferably, the reference current generator produces a reference current between levels of a true value and a false value defined by the logical value determination circuit. In this case, true or false is determined depending simply on whether or not the electric current flowing through the logical value determination circuit is larger than the reference current.

Preferably the reference current generator produces a reference current which lies between an electric current of zero level (i.e., no current flowing through the determination circuit) and a minimum logic current that can flow through the logical value determination circuit. In this case, if no current flows, a value of FALSE is output. If any current flows through any electric path in the logical value determination circuit, a value of TRUE is output because the reference current is set so as to be smaller than the minimum current which can flow through the logical value determination circuit.

With this arrangement, logic can be correctly determined every time even with the smallest current. If a larger current flows in the logical value determination circuit, a sufficient margin for logic determination is taken, and the reliability of the logic determination is improved. In addition, even though the power source of the logical value determination circuit or the reference current generator fluctuates, true or false is accurately determined based on a difference in current, and error determination is substantially eliminated.

No matter how complicated the structure the logical value determination circuit becomes, an appropriate reference current can be set very simply because any value smaller than the minimum current which possibly flows through the logical value determination circuit can be used as the reference.

The reference current generator comprises one or more reference current generating elements connected in series. These elements define an electric path, the cross-section of which is smaller than that of the minimum-current electric path in the logical value determination circuit. Preferably, the structure of the reference current generating elements is the same as the structure of the logical value determination elements of the minimum-current electric path.

This arrangement allows the reference current generator to be fabricated very easily by copying the minimum current path, except for the cross-sectional area or the channel width.

In another aspect of the invention, a semiconductor integrated circuit having one or more current-sense type logic circuits is provided. Each logic circuit comprises a logical value determination circuit, a reference current generator, and a current sense amplifier. The logical value determination circuit defines a logical value, as a logic current, in response to multiple logic-signals inputted externally. The reference current generator produces a reference current, which is used to determine logic. The current sense amplifier detects and amplifies a difference between the reference current and the logic current flowing through the logical value determination circuit corresponding to the logical value.

This arrangement allows high-speed operations, while preventing undesirable operation delay time. Consequently, and the performance of the entire circuit is greatly improved.

BRIEF DESCRIPTION OF THE DRAWINGS

The above and other objects and advantages of the invention will become apparent from the following detailed description in conjunction with the accompanying drawings, in which.

DETAILED DESCRIPTION OF THE INVENTION

The preferred embodiments of the invention will now be described with reference to the drawings.

First Embodiment

Figure 1:
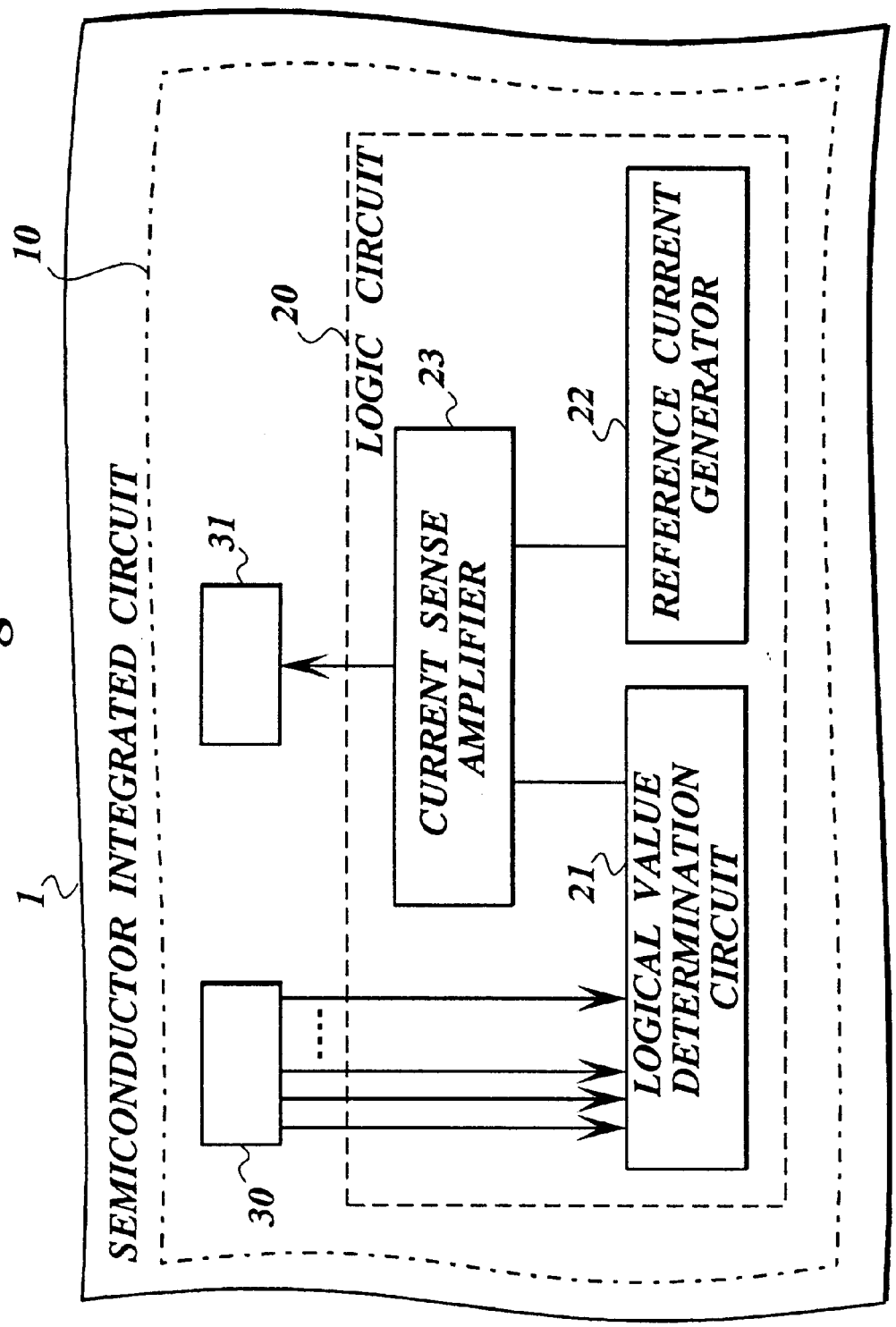
FIG. 1 is a schematic block diagram of the current-sense type logic circuit and the semiconductor integrated circuit, on which the logic circuit is mounted, according to the first embodiment of the invention.

FIG. 1 shows a logic circuit 20, which is incorporated in a circuit system 10 of a semiconductor integrated circuit 1. The logic circuit 20 has a logical value determination circuit 21, a reference current generator 22, and a current sense amplifier 23. The logic value determination circuit 21 defines a logical value in response to multiple logical input signals, and produces an electric logic-current in accordance with the logical value. The reference current generator 22 produces a reference current, which is used to determine logic. The current sense amplifier 23 detects and amplifies a difference between the reference current and the logic current flowing through the logical value determination circuit.

In this embodiment, multiple logic circuits 20 are incorporated in the semiconductor integrated circuit 10. A previous-stage logic circuit 30 is connected to the logical value determination circuit 21 of the logic circuit 20, and the output of the current sense amplifier 23 is connected to the next-stage logic circuit 31. The previous-stage logic circuit 30 supplies logical input signals to the logical value determination circuit 21.

The previous-stage logic circuit 30 may be a decoder, or alternatively, the logical input signals may be input from outside the integrated circuit 10 directly to the logical value determination circuit 21 of the logic circuit 20. The next-stage logic circuit 31 is not necessarily the logic circuit. Alternatively, the logic determination result may be output from the logic circuit 20 directly to outside the integrated circuit 20.

Figure 2:
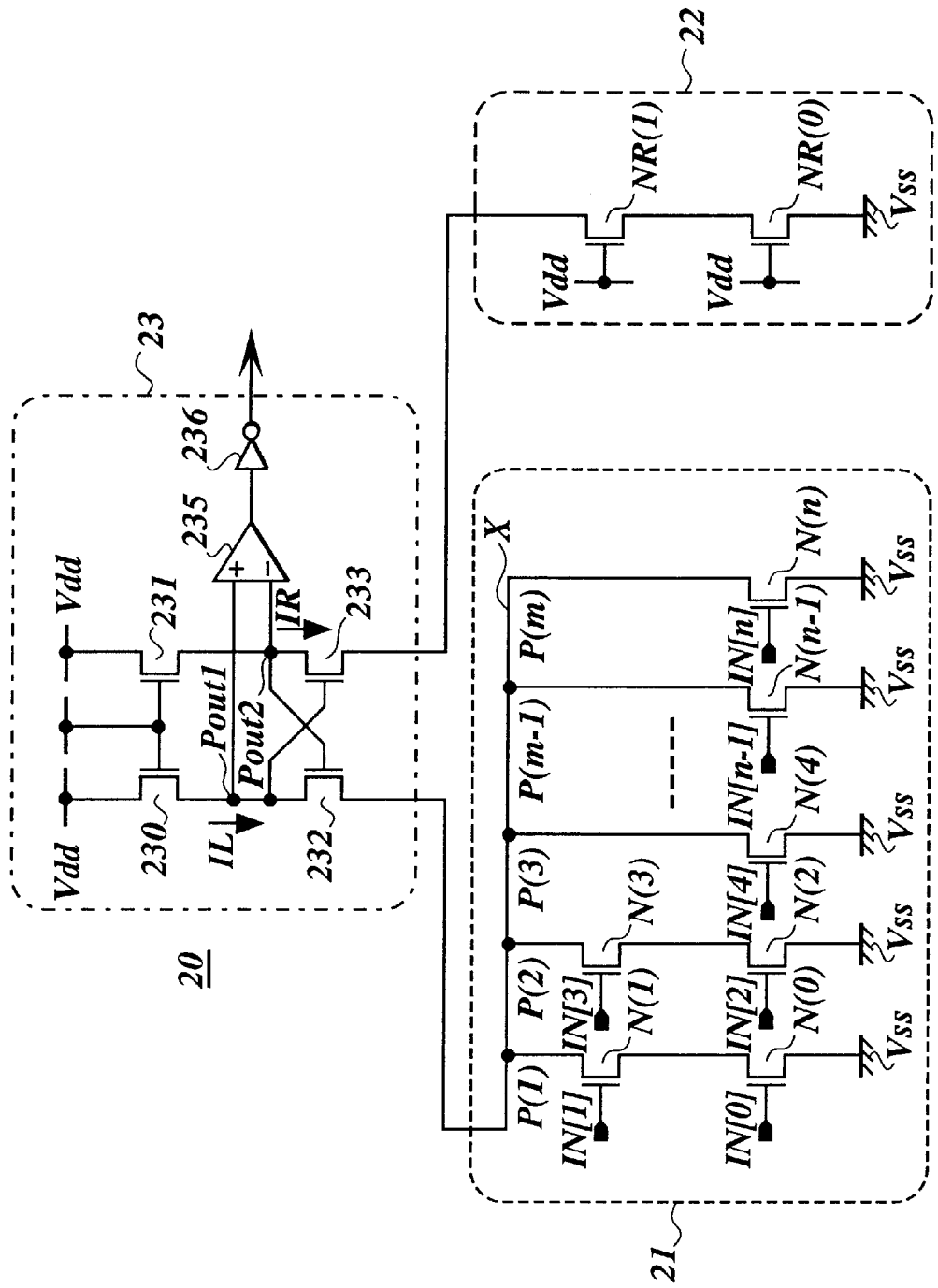
FIG. 2 is a circuit diagram of the logic circuit shown in FIG. 1.

FIG. 2 is a circuit diagram of the logic circuit 20 shown in FIG. 1. The logical value determination circuit 21 has a plurality of logical value determination elements between the logic node X and the standard voltage Vss. In this embodiment, the logical value determination elements are n-channel IGFETs (insulated gate field effect transistors) with switching functions. IGFET is, for example, a MOSFET having a silicon oxide gate insulating film, or a MISFET having a single-layer or a multi-layered gate insulting film made of oxynitride or silicon nitride. The standard voltage is the 0V-ground voltage in this embodiment.

To be more precise, the IGFETs N(0), N(1), ..., N(n−1) and N(n) are arranged between the logic node X and the ground. These IGFETs define multiple paths P(0), P(1), ..., P(m) between the logic node X and the standard voltage Vss. IGFETs N(0) and N(1) are connected in series in path P(1), and IGFET N(2) and N(3) are connected in series in path P(2). The rest of the paths include a single IGFET.

The drain of IGFET N(1) is connected to the logic node X, the source of N(1) is connected to the drain of N(0), and the source of N(0) is connected to standard voltage Vss. Similarly, the drain of IGFET N(3) is connected to the logic node X, the source of N(3) is connected to the drain of N(2), and the source of N(2) is connected to the standard voltage Vss. The drain and the source of each of the IGFET N(4) through N(n) are connected to the logic node X and the standard voltage Vss, respectively. In this fashion, the multiple paths are electrically connected in parallel between the logic node X and the standard voltage Vss.

The gate of each IGFET is connected to one of the multiple logical input signals IN[0], IN[1], ..., IN[n−1] and IN[n] which are supplied from the previous-stage logic circuit 30. Each logical input signal IN is either high (H) or low (L). With a high-level input signal applied to the gate, the IGFET is turned on, and with a low-level input signal applied to the gate, the IGFET is turned off.

If high-level input signals IN[0] and IN[1] are input to the IGFETs N(0) and N(1) of path P(1), the both elements are turned on, and accordingly, an electric current flows through the path P(1). The current IL of the logic node X changes from LOW (IL=0) to HIGH (IL>IR), which means that the logical value defined by the logical value determination circuit 21 becomes FALSE. The current-sense type logic circuit 20 of this embodiment is a logic circuit having an inverter 236 which inverts the logical value supplied from the logical value determination circuit 21 and outputs an inverted logical value as the final result of the logic determination. Accordingly, the logic determined by the logic circuit 20 is TRUE. If a low-level input signal is input to at least one of the elements N(0) and N(1) of path P(1), no current flows through the path P(1) (IL=0<IR). Accordingly, the logical value defined by the logical value determination circuit 21 is true, and the final logic output from the logic circuit 20 becomes FALSE.

The same thing applies to path P(2). With high-level input signals IN[2] and IN[3], an electric current flows through the path P(2) (IL>IR). The logical value defined by the logical value determination circuit 21 becomes FALSE, and the final logic output from the logic circuit 20 is TRUE. With a low-level input signal at the elements N(2) and/or N(3), no current flows through the path P(2) (IL=0<IR), and a logical value of TRUE is defined by the logical value determination circuit 21. In response to this determination, the final logic output from the logic circuit 20 becomes FALSE.

As to the single-element paths P(3) through P(m), if a high level input signal is input to the gate, the IGFET is switched on and an electric current flows (IL>IR). The logical value of the determination circuit 21 becomes FALSE. If a low-level input signal is input, the IGFET is switched off, and no electric current flows through the associated path. Accordingly, the logical value of the determination circuit 21 becomes TRUE.

Preferably, the IGFET N(0) through N(n) have the same size and structure with the same channel width and the channel length, so that they can be manufactured at a time by the same manufacturing process. In this case, the resistance of the paths P(1) and P(2) is equal, and the resistance of the paths P(3) through P(m) is equal, which is about one half of the resistance of the paths P(1) and P(2). Thus, the change in electric current that can flow through the electric paths is kept small.

The reference current generator 22 produces a reference current IR, which is to be used to determine whether the logic is true or false. The reference current IR is set to any value between the electric-current levels of "true" and "false" of the logical value. With this arrangement, true or false can be determined simply by checking whether or not the electric current flowing through the logical value determination circuit 21 is large than the reference current IR.

In this embodiment, the reference current is set so that it lies between the zero current (with no electric current flowing through any paths) and the minimum current that can flow through the path in accordance with the logical input signals supplied from the previous stage. With the logical value determination circuit 21, the electric paths have different resistances, and therefore, different quantities of electric current flow. To be more precise, the paths P(1) and P(2) have a larger resistance, as compared with the other paths, because of the serially connected two IGFETs. Accordingly, the electric current flowing through either path P(1) or P(2) becomes the minimum current among the electric paths. Since the reference current is set so as to be smaller than the minimum current that can flow through the determination circuit 21, the logic can be determined simply by watching whether no current flows or any current flows. If any current flows, the logical value of the determination circuit 21 becomes FALSE.

In this fashion, even though the quantity of electric current flowing through the determination circuit 21 is minimum, logic determination is correctly executed using the reference current IR. If a larger current flows, a sufficient margin is taken, and the determination results become more reliable. With this arrangement, the precision of logical determination can be maintained even if the operation power source Vdd or the standard voltage Vss of the logic circuit 20 fluctuates. Accordingly, error determinations can be greatly reduced, and the operation reliability of the logic circuit 20 is improved.

In this embodiment, the reference current generator 22 comprises two elements, which define an electric path. These elements have the same configuration as the logic value determination elements, except for the channel width, or the cross-sectional area of the electric path. As shown in FIG. 2, the reference current generator 22 has n-channel IGFETs NR(0) and NR(1), which are electrically connected in series. This arrangement is the same as the minimum-current paths P(1) and P(2) of the logical value determination circuit 21. The drain of the IGFET NR(1) is connected to the current-sense amplifier 23, the source of the NR(1) is connected to the drain of the NR(0), and the source of the NR(0) is connected to the standard voltage Vss. The gates of the NR(0) and NR(1) are connected to the operation voltage source Vdd, so that the NR(0) and NR(1) are always in the ON state.

The channel widths of the IGFETs NR(0) and NR(1) are set to smaller than the channel width of the IGFETs N(0) through N(3) of the minimum-current paths P(1) and P(2). This results in that the reference current IR generated by this reference current generator 22 becomes smaller than the minimum current that can flow through the logical value determination circuit 21. Preferably, the channel width of the IGFETs NR(0) and NR(1) is set to one half of the channel width of the IGFETs N(0) through N(3). In this case, the generated reference current IR lies in the middle between the logic TRUE (i.e., the zero current) and logic FAUSE (i.e., at least the minimum current). In addition, fabricating transistors having a half channel width is easier, as compared with forming transistors with a channel width of one-third ($1/3$) or three quarter ($3/4$), in design and patterning.

The operation voltage Vdd applied to the gates of NR(0) and NR(1) is 3V to 5V in this embodiment.

The current sense amplifier 23 has first and second output nodes Pout 1 and Pout 2. A first load 230 is connected between the voltage source Vdd and the first output node Pout 1. A first driving transistor 232 is connected between the first output node Pout 1 and the logical value determination circuit 21. A second load 231 is connected between the voltage source Vdd and the second output node Pout 2. A second driving transistor 233 is connected between the second output node Pout 2 and the reference current generator 22. The gate of the first driving transistor 232 is connected to the second output node Pout 2, while the gate of the second driving transistor 233 is connected to the first output node Pout 1, forming cross paths.

The first and second loads 230 and 231 are n-channel IGFETs. The gates of the IGFETs 230 and 231 are connected to the voltage source Vdd, and maintained in the ON state.

The first and second driving transistors 232 and 233 are also n-channel IGFETs. The source of the first transistor 232 is connected to the logic node X of the logical value determination circuit 21, and the source of the second transistor 233 is connected to the reference current generator 22 (and more precisely, to the drain of the IGFET NR(1)).

As has been described, the current sense amplifier 23 has a cross coupling configuration, with the gate of the second transistor 233 connected to the first output node Pout 1 and the gate of the first driving transistor 232 connected to the second output node Pout 2. This arrangement allows the first and second transistors 232 and 233 to be controlled so that the electric-current difference between the first and second output nodes Pout 1 and Pout 2 is amplified.

The current sense amplifier 23 also includes a voltage sense amplifier 235, which detects and amplifies the voltage difference between the first and second output nodes Pout 1 and Pout 2, and an inverter 236, which inverts and enhances the output of the voltage sense amplifier 235. The voltage sense amplifier 235 and the inverter 236 are used in order to fully swing the voltage level because the outputs from the nodes Pout 1 and Pout 2 are generally insufficient to drive the next-stage logic circuit 31. The output of the inverter 236 is the final determination result of the logic circuit 20.

Next, the operation of the current-sense type logic circuit 20 will be described in more detail.

To obtain a logical value of TRUE as the final output of the logic circuit 20, electric current must flow through at least one electric path in the logical value determination circuit 21. An electric current IL (also referred to as a logic current) is always flowing from the voltage source Vdd of the current sense amplifier 23 up to the logic node X of the logical value determination circuit 21, via the first load 230 and the first driving transistor 232. Meanwhile, an electric current flowing from the voltage source Vdd to the reference current generator 22, via the second load 231 and the second driving transistor 233, is attenuated by the transistors NR(0) and NR(1), in order to generate a reference current IR is generated. The channel widths of the IGFETs NR(0) and NR(1) are selected such that the reference current IR lies between the zero-current, which corresponds to the logical value of FALSE of the determination circuit 21, and the minimum current that can flow through the logical value determination circuit 21.

If high-level logical input signals IN[0] and IN[1] are input to the IGFETs N(0) and N(1), and if low-level input signals are input to the rest of the IGFETs in the logical value determination circuit 21, then only the IGFETs N(0) and N(1) are turned on. Therefore, electric current IL flows into the path P(1), while no current flow through the rest of the paths. At this point of time, the logical value of the logical value determination circuit is defined as false because the logic node X has become L.

The logic current IL flowing through the output node Pout 1 of the current sense amplifier 23 is attenuated by the resistance (i.e., IGFETs) of the path P(1). The difference between the attenuated logic current IL flowing through the first output node Pout 1 and the reference current IR flowing through the output node Pout 2 is detected and amplified by the current sense amplifier 23. Since the current sense amplifier 23 has detected that the logic current IL flowing through the first output node Pout 1 decreased, the logical value of false is obtained at the logical value determination circuit 21. In this manner, the logical value of the determination circuit 21 is determined based on any change in the logic current IL detected by the current sense amplifier 23.

The current difference between the logic current IL flowing through the first output Pout 1 and the reference current IR through the second output Pout 2 is detected and amplified as a voltage difference by the voltage sense amplifier 235. The output of the voltage sense amplifier 235 is connected to the input of the inverter 236. The inverter 236 inverts the logical value of false determined by the logical value determination circuit 21, and outputs the final logical value of TRUE.

On the contrary, to obtain a logical value of FALSE as the final output of the logic circuit 20, electric current must not flow through the electric paths in the logical value determination circuit 21. Again, an electric current (or a logic current) IL always appears at the logic node X of the logical value determination circuit 21, and the reference current always appears at the second output node Pout 2 of the current sense amplifier 23 because of the reference current generator 22.

If a high-level logical input signal is applied to only one of the IGFETs N(0) through N(3), with low-level signals applied to the rest of the IGFETs N(4) through N(n), then no electric current flows from the logic node X into any paths.

In this case, no change occurs in the logic current IL that is flowing through the output node Pout 1. The current sense amplifier 23 detects and amplifies the current difference between the non-attenuated logic current IL through the output node Pout 1 and the reference current IR through the output node Pout 2. At this point of time, the logical value of true is determined by the determination circuit 21 because the electric current at the first output node Pout 1 (or the current level of the logic node X) is maintained without any change.

The current difference between the non-attenuated logic current IL flowing through the first output Pout 1 and the reference current IR flowing through the output node Pout 2 is detected and amplified as a voltage difference by the voltage sense amplifier 235. The output of the voltage sense amplifier 235 is connected to the input of the inverter 236. The inverter 236 inverts the logical value of true determined by the logical value determination circuit 21, and output the final logical value of FALSE.

In this fashion, the current sense amplifier 23 detects only the small current difference between the reference current IR generated by the reference current generator 22 and the logic current IL flowing through the logical value determination circuit 21 in accordance with the logical input signals. The electric current IL represents the logical value of the logical value determination circuit 21, and true or false can be determined simply depending on whether or not any electric current flows through the electric paths of the determination circuit 21. With this arrangement, it is not necessary to charge the parasitic capacitance of the logic node X and to wait until the voltage reaches the threshold value. The final logical value is output based only on the change in the electric current statically flowing in accordance with the logical input signals, without causing the voltage at the logic node X to swing. Therefore, the delay time defined by Equation (1) is greatly reduced, regardless of the parasitic capacitance, and the operation speed of the logic circuit 20 is improved.

This arrangement is especially effective to a multi-input logic circuit with a complicated determination circuit. Even if the number of inputs increased from twenty to fifty, and some paths have two or more transistors, the final logical value is promptly output based only on the current difference between the logic current and the reference current. The reference current can be set very simply so as to be smaller than the minimum logic current.

In other words, since the reference current is set between the zero current and the minimum current, logical true or false can be determined depending only on whether or not a logic current flows in the logical value determination circuit 21. In addition, even if a small quantity of logic current flows with a very small difference between the reference current and the logic current, logical determination is correctly executed. If a larger current flows, the determination margin is broadened, and consequently, the determination reliability of the logic circuit 20 rises. Furthermore, even if the voltage source Vdd or the standard voltage Vss fluctuates, the logical value can be correctly determined, and error determination is greatly reduced.

Furthermore, the transistors used in the logical value determination circuit 21 and the transistors used in the reference current generator 22 have the same structure, except for the channel width, the reference current generator 22 can be fabricated easily.

If many logic circuits 20 are mounted on a semiconductor integrated circuit to form a circuit system, the operation speed of the entire circuit system can be greatly improved because each logic circuit 20 has high-speed operation ability.

In place of the n-channel IGFETs, p-channel IGFETs may be used in the logical value determination circuit 21 of the logic circuit 20. Alternatively, bipolar transistors may be used. In either case, it is practical to form the reference current generator 22 with the same type of transistors as those used in the logical value determination circuit 21.

Although, in the first embodiment, the logical value determination circuit 21 includes two electric paths having two serially connected transistors, three or more electric paths may have serially connected transistors. The number of transistors serially connected in each path is not limited to two.

The current sense amplifier 23 may have a complementary IGFET structure. In this case, the first and second loads 230 and 231 are made of p-channel IGFETs.

The first and second loads 230 and 231 may be resistors, such as polysilicon resistors or diffused resistors.

Alternatively, the first and second loads 230 and 231, and the first and second driving transistor 232 and 233 may be bipolar transistors.

Second Embodiment

In the second embodiment, the current sense amplifier 23 of the logic circuit 20 is a latch-type current sense amplifier 23.

Figure 3:
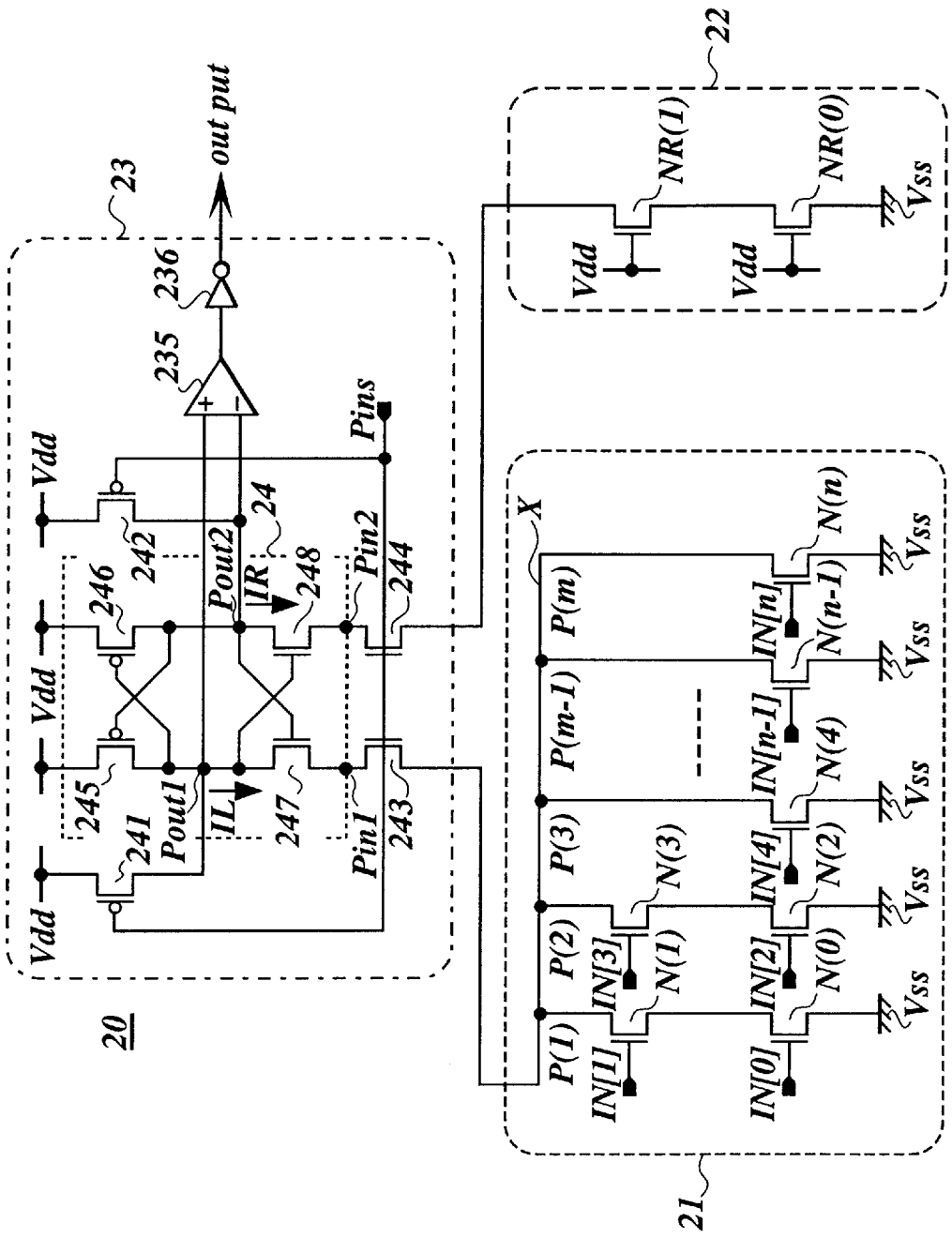
FIG. 3 is a circuit diagram of the logic circuit according to the second embodiment of the invention.

FIG. 3 illustrates the logic circuit 20 according to the second embodiment. The current sense amplifier 23 has a latch 24, which comprises p-channel IGFETs 245 and 246, and n-channel IGFETs 247 and 248. The latch-type current sense amplifier 23 also has a strobe signal input node Pins, two n-channel IGFETs 243 and 244, two p-channel IGFETs 241 and 242, a voltage sense amplifier 235, and an inverter 236.

A strobe signal, which is either high or low, is input to the strobe signal input node Pins. The strobe signal controls the activation and the precharge (i.e., the initialization) of the latch 24.

The source of the p-channel IGFET 245 of the latch 24 is connected to the voltage source Vdd, the drain of the IGFET 245 is connected to the first output node Pout 1, and the gate of the IGFET 245 is connected to the second output node Pout 2. The source of the p-channel IGFET 246 is connected to the voltage source Vdd, the drain of the IGFET 246 is connected to the second output node Pout 2, and the gate of the IGFET 246 is connected to the first output node Pout 1.

The source of the n-channel IGFET 247 is connected to the drain of the IGFET 243, the drain of the IGFET 247 is connected to the first output node Pout 1, and the gate of the IGFET 247 is connected to the second output node Pout 2. The source of the IGFET 247 functions as the first input node Pin 1 of the latch 24. The source of the n-channel IGFET 248 is connected to the drain of the IGFET 244, the drain of the IGFET 248 is connected to the second output node Pout 2, and the gate of the IGFET 248 is connected to the first output node Pout 1. The source of the IGFET 248 functions as the second input node Pin 2 of the latch 24.

The source of the IGFET 243 is connected to the logic node X, the drain of the IGFET 243 is connected to the first input node Pin 1 of the latch 24, and the gate of the IGFET 243 is connected to the strobe signal input node Pins. The IGFET 243 is used as activation IGFET for the latch 24. If a high-level strobe signal is input to the strobe signal input node Pins, the activation IGFET 243 is turned on. Upon turning on the IGFET 234, the latch-type current sense amplifier 23 is electrically connected to the logical value determination circuit 21, whereby a logic current IL is allowed to flow into the logical value determination circuit 21. If a low-level strobe signal is input to the strobe signal input node Pins, the activation IGFET 243 is turned off, and the no current flows into the logical value determination circuit 21.

The source of the IGFET 244, which also functions as the activation IGFET, is connected to the reference current generator 22. The drain of the IGFET 244 is connected to the second input node Pin 2 of the latch 24, and the gate of the IGFET 244 is connected to the strobe signal input node Pins. The activation IGFET 244 is turned on, upon receiving a high-level strobe signal, to connect the latch-type current sense amplifier 23 to the reference current generator 22. Upon the connection, the reference current IR flows through the second output node Pout 2 of the latch-type current sense amplifier 23. If a low-level strobe signal is input to the strobe signal input node Pins, the IGFET 244 is turned off, and the current flow of the reference current IR is cut off.

The IGFET 241 functions as a precharge IGFET or a Vdd initialization IGFET 241. The source of the precharge IGFET 241 is connected to the voltage source Vdd, the drain of the IGFET 241 is connected to the first output node Pout 1, and the gate of the IGFET 241 is connected to the strobe signal input node Pins. The precharge IGFET 241 is turned on when a low-level strobe signal is input to the strobe signal input node Pins. Upon turning on the precharge IGFET 241, the first output node Pout 1 is connected to the voltage source Vdd. Accordingly, the firsts output node Pout 1 is precharged during the non-activated state of the latch-type current sense amplifier 23 (in which the current sense amplifier 23 is disconnected from the logical value determination circuit 21).

Another precharge IGFET 242 is also turned on when a low-level strobe signal is input to the strobe signal input node Pins to connect between the second output node Pout 2 and the voltage source Vdd. The precharge IGFET 242 charges the second output node Pout 2 during the non-activated state of the latch-type current sense amplifier 23 (which is disconnected from the reference current generator 22).

In operation of the latch-type current sense amplifier 23 according to the second embodiment, if a low-level strobe signal is input to the strobe signal input node Pins of the latch-type current sense amplifier 23, the activation IGFETs 243 and 244 are turned off. Accordingly, the latch-type current sense amplifier 23 is disconnected from the logical value determination circuit 21, and it enters the non-activated state, in which a precharge or initialization action is taken. In the non-activated state, the precharge IGFETs 241 and 242 are turned on, and the first and second output nodes Pout 1 and Pout 2 are charged from the voltage source Vdd via the IGFET 241 and 242, respectively.

The logical value inputted to the logical value determination circuit 21 is defined during the non-activated state (or the precharge state) of the latch-type current sense amplifier 23. If the logical value is defined as TRUE by the determination circuit 21, the logic node X is in the floating state, while with the logical value of FLASE the logic node X is at the level of the standard voltage Vss (or in the ground state in this embodiment). At this time, the voltage level of the wiring node between the reference current generator 22, which is always in the ON state, and the second input node Pin 2 turns into the standard voltage Vss.

Then, if a high-level strobe signal is input to the strobe signal input node Pins after the logical value is determined by the logical value determination circuit 21, the activation IGFETs 243 and 244 are turned on. The latch-type current sense amplifier 23 is connected to the logical value determination circuit 21 and to the reference current generator 22, and the latch-type current sense amplifier 23 is activated. At this point of time, the output nodes Pout 1 and Pout 2 have already been charged during the non-activated state. Accordingly, a logic current IL corresponding to the logical value defined by the logical value determination circuit 21 flows through the first output node Pout 1, and the reference current flows through the second output node Pout 2. As in the first embodiment, the current difference between the logic current IL at the first output node Pout 1 and the reference current IR at the second output node Pout 2 is detected and amplified by the latch-type current sense amplifier 23. The activated state is latched by means of the latch 24. At this time, the precharge IGFET 241 and 242 are OFF because of the high-level strobe signal.

The current difference between the logic current IL and the reference current IR is detected as a voltage difference by the voltage sense amplifier 235. The voltage difference is amplified and output to the inverter 236. The inverter 236 inverts the logical value defined by the logical value determination circuit 21, and outputs the final logical value of the logic circuit 20.

Because the latch-type current sense amplifier 23 is used in the second embodiment, the power consumption of the logic circuit 20 can be reduced because the activation of the current sense amplifier 23 is suspended when no logical value is output from the logic circuit 20 in the precharge state. Off course, the logic circuit 20 of this embodiment can achieve the same effect as in the first embodiment.

Third Embodiment

The logic circuit 20 according to the third embodiment is configured so that the timing margin of the action of the latch-type current sense amplifier 23 is further improved.

Figure 4:
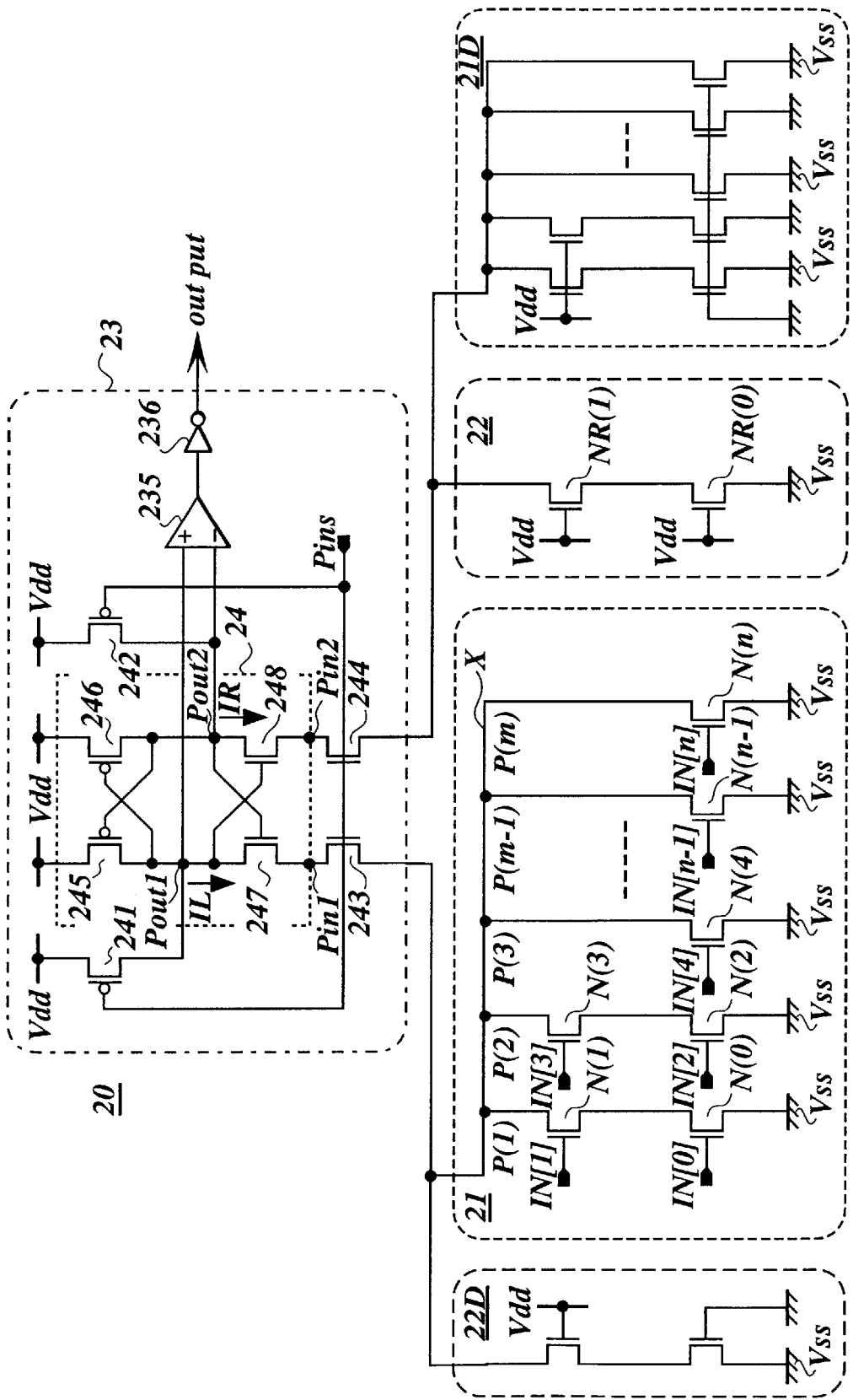
FIG. 4 is a circuit diagram of the logic circuit according to the third embodiment of the invention.

FIG. 4 illustrates the logic circuit 20 according to the third embodiment. A dummy circuit 22D, which has substantially the same structure as the reference current generator 22, is connected to the latch-type current sense amplifier 23 in parallel to the logical value determination circuit 21. A dummy circuit 21D, which has substantially the same structure as the logical value determination circuit 21, is connected to the latch-type current sense amplifier 23 in parallel to the reference current generator 22.

The dummy circuit 22D adds a parasitic capacitance equal to that of the reference current generator 22 to the first output node Pout 1 of the latch-type current sense amplifier 23. The dummy circuit 21D adds a parasitic capacitance equal to that of the logical value determination circuit 21 to the second output node Pout 2 of the latch-type current sense amplifier 23.

The dummy circuit 22D has two serially-connected n-channel IGFETs. The IGFET on the logic node side is set to the ON state, and the IGFET connected to the ground is set to the OFF state, so that the sum of the parasitic capacitance of the two transistors is added to the first output node Pout 1. The dummy circuit 21D has two double-transistor paths and (m-2) single-transistor paths. All the IGFETs connected to the standard voltage Vss are set to OFF. The other two IGFETs connected to the wiring node between the latch-type current sense amplifier 23 and the reference current generator 22 are set to ON, whereby the sum of the parasitic capacitance of all the IGFETs is added to the second output node Pout 2.

Because the dummy circuits 21D and 22D are added to the logic circuit 20, the parasitic capacitance added to the first output Pout 1 becomes equal to the parasitic capacitance added to the second output node Pout 2. Accordingly, the timing margin between the determination of the logic value of the logical valued determination circuit 21 and the activation of the latch-type current sense amplifier 23 in response to the strobe signal applied to the strobe signal is evened. This arrangement can further improve the reliability of the logic circuit 20.

Fourth Embodiment

In the fourth embodiment, a logical value determination circuit 21 with a more complicated structure is used.

Figure 5:
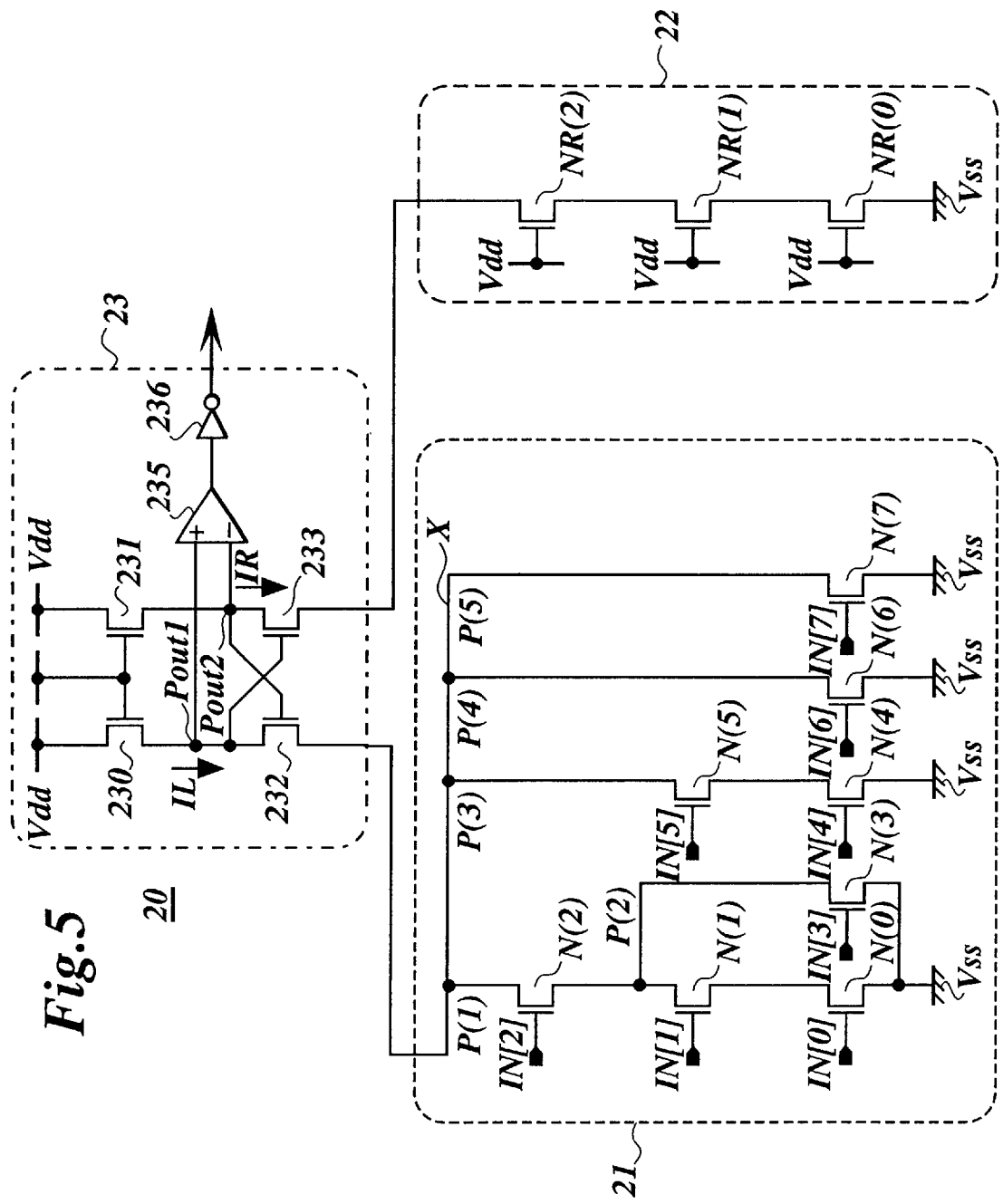
FIG. 5 is a circuit diagram of the logic circuit according to the fourth embodiment of the invention.

FIG. 5 illustrates the logic circuit 20 according to the fourth embodiment. The first path P(1) of the logical value determination circuit 21, which extends between the logic node X and the ground, includes three IGFETs N(0), N(1), and N(2) connected in series. The second path P(2) is branched from the path P(1), in which IGFETs N(2) and N(3) are connected in series. The third path P(3) includes IGFET N(4) and N(5) connected in series. The paths P(4) and P(5) are single-transistor paths, with IGFETs N(6) and N(7) inserted to the respective paths. If all the IGFETs have the same structure, the electric current flowing through the path P(1) is the minimum current among the electric paths.

In this case, the reference current generator 22 is formed with three IGFETs NR(0), NR(1), and NR(2), which are connected in series, like the first path P(1). The IGFETs NR(0), NR(1), and NR(2) have the same structure as the IGFETs N(0), N(1) and N(2), except for the channel width. The channel width of the IGFETs used in the reference current generator 22 is set to one half of those in the path P(1) of the logical value determination circuit 21.

With this structure, the reference current is again set smaller than the minimum logic current that can flow through the logical value determination circuit.

Figure 6:
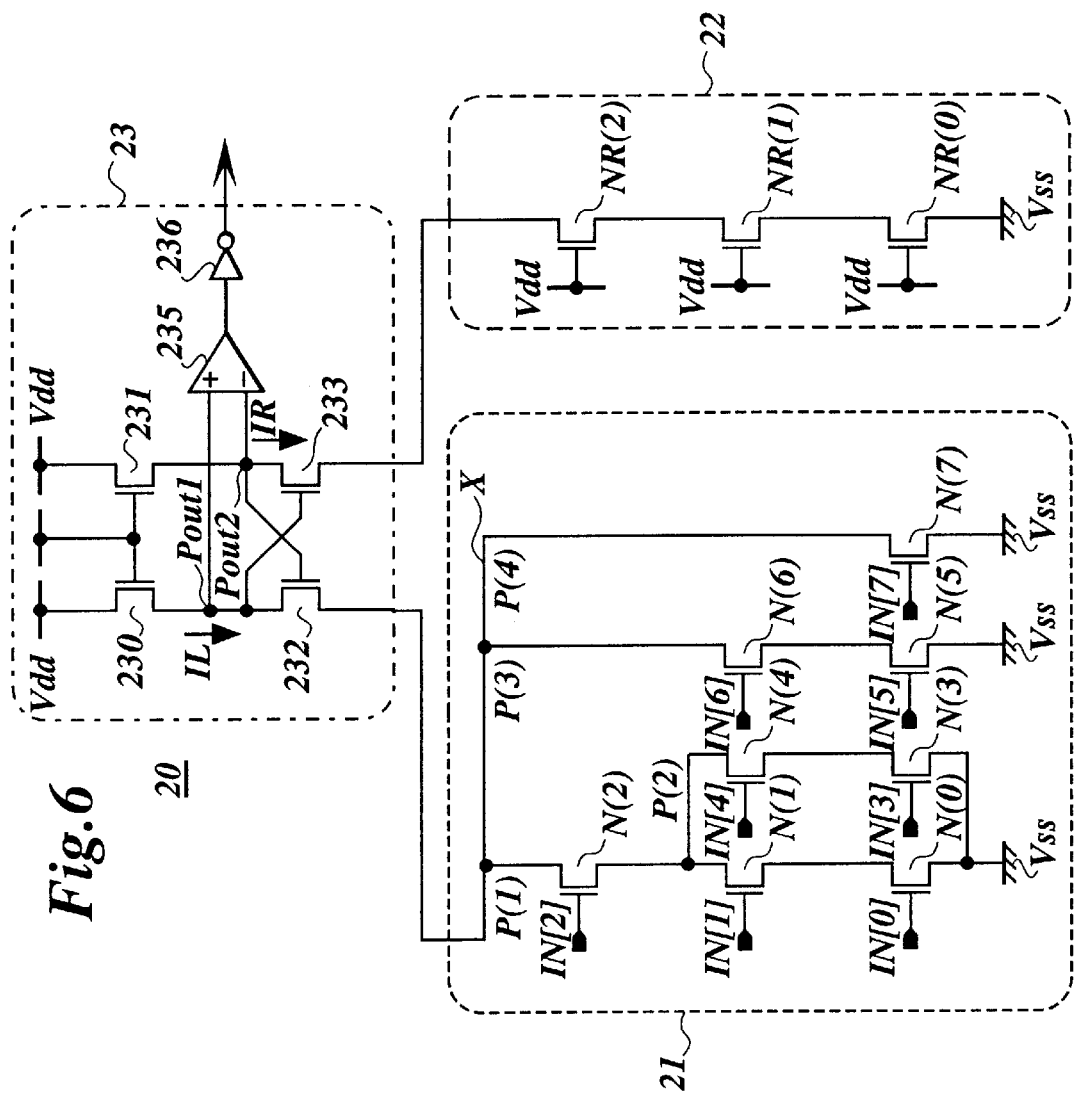
FIG. 6 is a circuit diagram of a modification of the logic circuit shown in FIG. 5.
Figure 7:
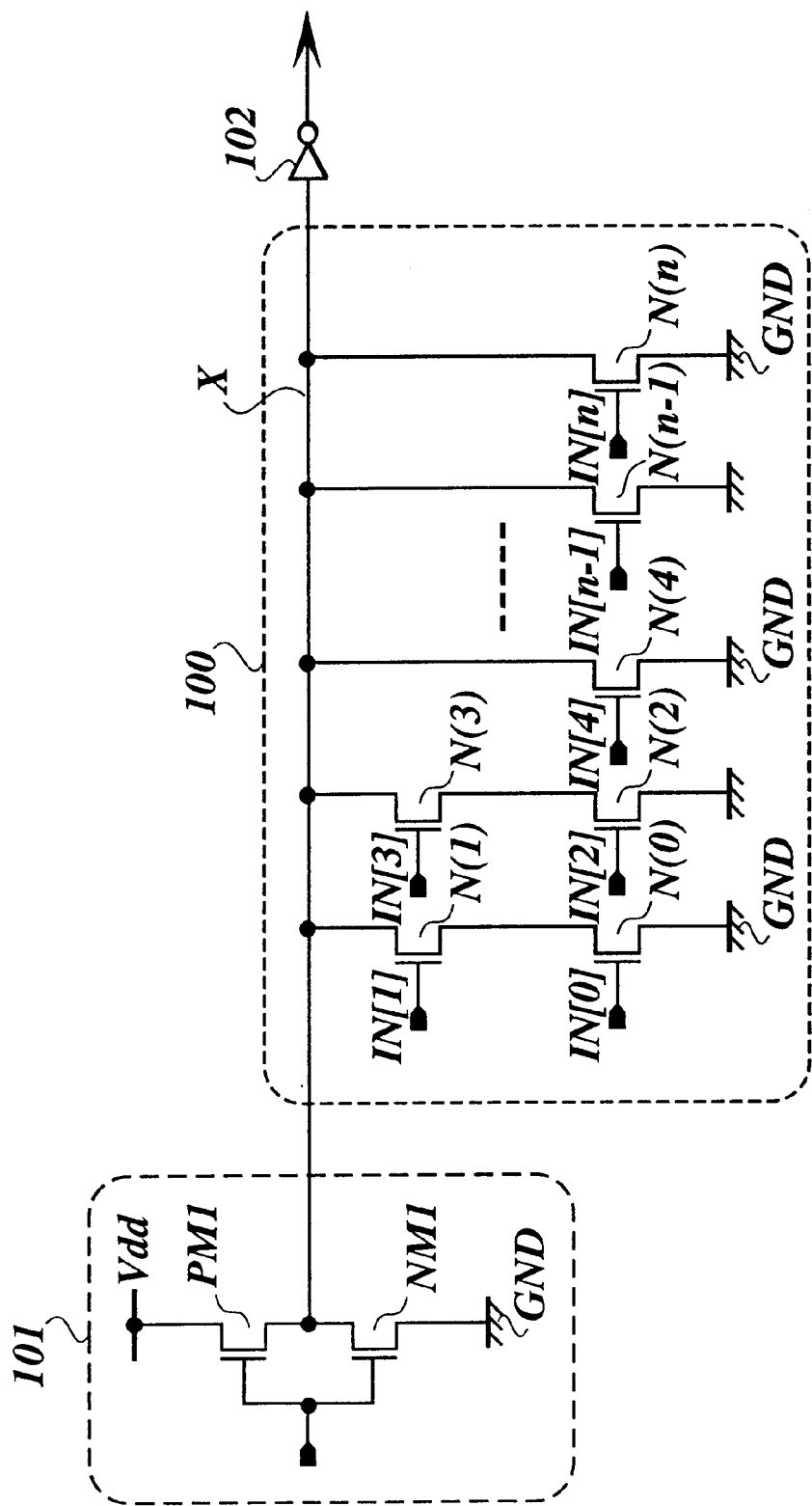
FIG. 7 illustrates a conventional multi-input logic circuit.

FIG. 6 illustrates a modification of the logical value determination circuit 21 shown in FIG. 5. In this case, the path P(2) branches from path P(1), and includes three transistors N(2), N(3), and N(4). If all the IGFET has the same structure, both paths P(1) and P(2) become the minimum current path. Accordingly, when fabricating the reference current generator 2, either path P(1) or P(2) can be referenced, but for the channel width, in order to produce a reference current smaller than the minimum current.

No matter how complicated the circuit structure of the logical value determination circuit 21 becomes, the reference current generator 22 can be fabricated very simply. The reference current is set so as to be smaller than the minimum current that can flow through the logical value determination circuit 21, and the logical value can be determined depending only on whether or not any logic current flows. It is not necessary to drive the parasitic capacitance added to the logic nodes up to the threshold level.

As has been described above, the logic circuit of the present invention is suitable for a multiple-input logical determination because the operation speed of the logic circuit is greatly improved by eliminating the delay time due to the parasitic capacitance.

Since the reference current is set smaller than the minimum logic current, a sufficient determination margin can be taken, and error determination is substantially eliminated.

After the logic is determined based only on the current difference between the logic current and the reference current, the current difference is amplified as a voltage difference, so that the next-stage logic circuit is reliably driven. Therefore, the present invention is preferably applied to a semiconductor integrated circuit in which a plurality of logic circuits are mounted. Since the delay time and the power consumption of each logic circuit are greatly reduced, the semiconductor integrated circuit can operate very quickly at low power consumption. Because of the greatly reduced error determination in each logic circuit, the reliability of the semiconductor integrated circuit is improved.

It should be noted that, besides those already mentioned above, many modifications and variations may be made without departing from the novel and advantageous features of the present invention. Accordingly, all such modifications and variations are intended to be included within the scope of the appended claims.

What is claimed is:

1. A current-sense type logic circuit comprising:

a logical value determination circuit configured to define a logical value and having a plurality of logic determination elements that define multiple electric paths extending in parallel between a logic node and a standard voltage source, each logic determination element having a control electrode configured to receive a logic input signal, and each electric path being controlled by an associated control electrode thereof based on the logic input signal applied to the control electrode;

a reference current generator configured to produce a reference current which is used to determine a logic; and a current sense amplifier configured to detect and amplify a difference between the reference current and an electric current flowing through the logical value determination circuit corresponding to the logical value.

2. The current-sense type logic circuit according to claim 1, wherein the current sense amplifier comprises:

first and second output nodes;

a first load connected between a voltage source and the first output node;

a first driving transistor connected between the first output node and the logical value determination circuit, the gate of the first driving transistor being connected to the second output node;

a second load connected between the voltage source and the second output node; and a second driving transistor connected between the second output node and the reference current generator, the gate of the second driving transistor being connected to the first output node.

3. The current-sense type logic circuit according to claim 2, wherein the logic node is connected to the first output node of the current sense amplifier.

4. The current-sense type logic circuit according to claim 3, wherein one or more logic determination elements are inserted in series in each of the electric paths between the logic node and the standard voltage.

5. The current-sense type logic circuit according to claim 4, wherein the reference current generator comprises one or more reference current generating elements, said one or more reference current generating elements being connected in series and defining an electric path with a cross-section smaller than the cross-section of a minimum-current electric path, through which the minimum current flows in the logical value determination circuit.

6. The current-sense type logic circuit according to claim 5, wherein the reference current generating elements and the logical value determination elements are insulating-gate field effect transistors, and the channel width of the reference current generating elements is about one half of the channel width of the logical value determination elements.

7. The current-sense type logic circuit according to claim 2, wherein the current sense amplifier further comprise:
   a voltage sense amplifier detecting a current difference between the currents output from the first and second output nodes and amplifying the current difference as a voltage difference; and
   an inverter for enhancing and inverting the logical value output from the voltage sense amplifier.

8. The current-sense type logic circuit according to claim 3, wherein the reference current generator produces a reference current which lies between an electric current of zero level and a minimum current that can flow through the electric paths according to the logical value defined by the logical value determination circuit.

9. The current-sense type logic circuit according to claim 1, wherein the reference current generator produces a reference current which lies between a current corresponding to a true value and a current corresponding to a false value of the logical value determination circuit.

10. The current-sense type logic circuit according to claim 1, wherein the current sense amplifier is a latch-type current sense amplifier.

11. The current-sense type logic circuit according to claim 10, wherein the latch-type current sense amplifier comprises:
    a latch circuit having first and second input nodes and first and second output nodes;
    a first activation insulating-gate field effect transistors connected between the first input node of the latch circuit and the logical value determination circuit;
    a second activation insulating-gate field effect transistors connected between the second input node of the latch circuit and the reference current generator;
    a first precharge insulating-gate field effect transistors connected between the first output node of the latch circuit and an operational voltage source; and
    a second precharge insulating-gate field effect transistors connected between the second output node of the latch circuit and the operational voltage source.

12. The current-sense type logic circuit according to claim 11, wherein the reference current generator comprises one or more reference current generating elements, said one or more reference current generating elements being connected in series and defining an electric path with a cross-section smaller than the cross-section of a minimum-current electric path through which the minimum current flows in the logical value determination circuit, and wherein the current-sense type logic circuit further comprises:
    a first dummy circuit connected to the first input node of the latch circuit of the latch-type current sense amplifier in parallel to the logical value determination circuit, the first dummy circuit having substantially the same structure as the reference current generator; and
    a second dummy circuit connected to the second output node of the latch circuit in parallel to the reference current generator, the second dummy circuit having substantially the same structure as the logical value determination circuit.

13. A semiconductor integrated circuit having a current-sense type logic circuit comprising:
    a logical value determination circuit configured to define a logical value and having a plurality of logic determination elements that define multiple electric paths extending in parallel between a logic node and a standard voltage source, each logic determination element having a control electrode configured to receive a logic input signal, and each electric path being controlled by an associated control electrode thereof based on the logic input signal applied to the control electrode;
    a reference current generator configured to produce a reference current which is used to determine a logic; and
    a current sense amplifier configured to amplify and output a difference between the reference current and an electric current flowing through the logical value determination circuit corresponding to the logical value.

14. The semiconductor integrated circuit according to claim 13, wherein the current sense amplifier comprises:
    a first output node and a second output node;
    a first load connected between a voltage source and the first output node;
    a first driving transistor connected between the first output node and the logical value determination circuit, the gate of the first driving transistor being connected to the second output node;
    a second load connected between the voltage source and the second output node; and
    a second driving transistor connected between the second output node and the reference current generator, the gate of the second driving transistor being connected to the first output node.

15. The semiconductor integrated circuit according to claim 14, wherein the logic node is connected to the first output node of the current sense amplifier.

16. The semiconductor integrated circuit according to claim 15, wherein one or more logic determination elements are electrically inserted in series in each of the electric paths between the logic node and the standard voltage.

17. The semiconductor integrated circuit according to claim 16, wherein the reference current generator comprises one or more reference current generating elements connected in series, said one or more reference current generating elements defining an electric path with a cross-section smaller than the cross-section of a minimum-current electric path, through which the minimum current flows in the logical value determination circuit.

18. The semiconductor integrated circuit according to claim 17, wherein the reference current generating elements and the logical value determination elements are insulating-gate field effect transistors, and the channel width of the reference current generating elements is one half of the channel width of the logical value determination elements.

19. The semiconductor integrated circuit according to claim 14, wherein the current sense amplifier further comprise:
    a voltage sense amplifier detecting a current difference between the currents output from the first and second output nodes and amplifying the current difference as a voltage difference; and
    an inverter for enhancing and inverting the logical value output from the voltage sense amplifier.

20. The semiconductor integrated circuit according to claim 13, wherein the current sense amplifier is a latch-type current sense amplifier.

21. The semiconductor integrated circuit according to claim 13, wherein the reference current generator produces a reference current of between a level of a true value and a level of a false value defined by the logical value determination circuit.

22. The semiconductor integrated circuit according to claim 13, wherein the reference current generator produces a reference current which lies between an electric current of zero level and a minimum current that can flow through the electric paths according to the logical value defined by the logical value determination circuit.

23. A current-sense type logic circuit comprising:

a logical value determination circuit configured to define a logical value, and having a plurality of logic determination elements that define multiple electric paths extending in parallel between a logic node and a standard voltage source, each logic determination element having a control electrode configured to receive a logic input signal, and each electric path being controlled by the associated control electrode based on the logic input signal applied to the control electrode;

a reference current generator configured to produce a reference current which is used to determine a logic, and having one or more reference current generating elements, said one or more reference current generating elements being connected in series and defining an electric path with a cross-section smaller than the cross-section of a minimum-current electric path, through which the minimum current flows in the logical value determination circuit;

a current sense amplifier configured to detect and amplify a difference between the reference current and an electric current flowing through the logical value determination circuit corresponding to the logical value;

a first dummy circuit connected to the current sense amplifier in parallel to the logical value determination circuit, the first dummy circuit having substantially the same structure as the reference current generator; and a second dummy circuit connected to the current sense amplifier in parallel to the reference current generator, the second dummy circuit having substantially the same structure as the logical value determination circuit.

24. A semiconductor integrated circuit having a current-sense type logic circuit comprising:

a logical value determination circuit configured to define a logical value, and having a plurality of logic determination elements that define multiple electric paths extending in parallel between a logic node and a standard voltage source, each logic determination element having a control electrode configured to receive a logic input signal, and each electric path being controlled by the associated control electrode based on the logic input signal applied to the control electrode;

a reference current generator configured to produce a reference current which is used to determine a logic, and having one or more reference current generating elements, said one or more reference current generating elements being connected in series and defining an electric path with a cross-section smaller than the cross-section of a minimum-current electric path, through which the minimum current flows in the logical value determination circuit;

a current sense amplifier configured to detect and amplify a difference between the reference current and an electric current flowing through the logical value determination circuit corresponding to the logical value;

a first dummy circuit connected to the current sense amplifier in parallel to the logical value determination circuit, the first dummy circuit having substantially the same structure as the reference current generator; and a second dummy circuit connected to the current sense amplifier in parallel to the reference current generator, the second dummy circuit having substantially the same structure as the logical value determination circuit.

* * * * *